United States Patent [19]

Chien

[11] Patent Number: 5,432,105
[45] Date of Patent: Jul. 11, 1995

[54] METHOD FOR FABRICATING SELF-ALIGNED POLYSILICON CONTACTS ON FET SOURCE/DRAIN AREAS

[75] Inventor: Sun-Chieh Chien, Hsin-Chu-City, Taiwan

[73] Assignee: United Microelectronics Corporation, Hsinchu, Taiwan

[21] Appl. No.: 308,310

[22] Filed: Sep. 19, 1994

[51] Int. Cl.[6] .......................................... H01L 21/8238
[52] U.S. Cl. ...................................... 437/34; 437/57; 437/162
[58] Field of Search ....................... 437/34, 57, 58, 56, 437/162; 148/DIG. 9

[56] References Cited

U.S. PATENT DOCUMENTS

| | | | |
|---|---|---|---|
| 4,717,684 | 1/1988 | Katto et al. | 437/57 |
| 4,824,796 | 4/1989 | Chiu et al. | 437/34 |
| 4,902,640 | 2/1990 | Sachitano et al. | 437/57 |
| 5,015,594 | 5/1991 | Chu et al. | 437/34 |

Primary Examiner—Brian E. Hearn
Assistant Examiner—Michael Trinh
Attorney, Agent, or Firm—George O. Saile

[57] ABSTRACT

Improved N-channel and P-channel field effect transistor device structure having self-aligned polysilicon pads contacts and a process for making such devices has been achieved. The doped polysilicon pad contact are formed over the source/drain areas of the field effect transistors and are used to form shallow self-aligned diffused contact to the source/drain areas. These polysilicon pads provide a low resistance ohmic contacts that are free from implant damage that would otherwise cause increased junction leakage current and are free of metal spiking at the source/drain area perimeter that would cause metal contact to substrate shorts. The increased area of the polysilicon pads over the source/drain area allows for relaxed design ground rule for the contact openings, making for a more manufacturable process for Ultra Large Scale Integration applications.

10 Claims, 4 Drawing Sheets

METHOD FOR FABRICATING SELF-ALIGNED POLYSILICON CONTACTS ON FET SOURCE/DRAIN AREAS

BACKGROUND OF THE INVENTION (1) Field of the Invention

The present invention relates to the formation of integrated circuit devices on semiconductor substrates, and more particularly a structure and a method of fabricating a field effect transistor having self-aligned polysilicon source/drain contacts.

(2) Description of the Prior Art

Today's Ultra Large Scale Integration (ULSI) on the semiconductor substrate is in part due to advances in high resolution photolithographic techniques and to advances in plasma etching of the various conducting and insulating layers on the substrate. In order to construct field effect transistors (FETs) on a chip with high density and improved performance it is necessary to form FETs with submicrometer channel lengths and having reduced source/drain contact areas. However, as this down scaling in device size on the semiconductor substrate surface continues it becomes necessary to also reduce the vertical dimensions, such as making more shallow source/drain diffusions on the FET.

Although the down scaling improves circuit density and performance, a number of adverse effects also occur. For example, when the electrically conducting channel is induced in the space charge region under the gate oxide, by applying a voltage to the gate electrode on the field effect transistor (FET), short channel effects occur when the channel length is scaled down in size. One such effect is the threshold voltage lowering. When the channel length is further reduced and is comparable in length to the source/drain diffusion depth, a considerable amount of the space charge is linked to the source/drain junction depletion region. This results in less charge in the space-charge region being coupled or linked to the gate and the threshold voltage of the FET decreases with decreasing channel length. This threshold voltage dependence on device geometry is undesirable because it makes it difficult to control the electrical design parameters in a manufacturing process.

Other major transistor phenomena that are affected by down scaling and degrade the transistor behavior include channel-length modulation, velocity saturation, mobility degradation, source/drain resistance, punch-through, drain induced barrier lowering and the likes.

To minimize the short channel effects, it is common practice in the semiconductor industry to fabricate FET structures with Lightly Doped Drains (LDD). These LDD FET structures are fabricated by forming a shallow lightly doped source/drain adjacent to the gate electrode and using a sidewall insulating spacer on the sidewall of the gate electrode to mask the LDD region from further doping. The source/drain contact is then formed by heavily doping the region adjacent to the sidewall spacers to form the ohmic source/drain contacts. Because the LDD region also increases the series resistance and thereby degrades the device performance, it is important to make the contact portion of the source/drain region as low as possible in resistance. Also, because of the down scaling of the FET device size to submicrometer dimensions, to achieve ULSI densities, it becomes even more difficult to align contact openings in the overlying insulating layer to the source/drain contact area.

The common approach to fabricating these LDD FETs in the industry is to dope the heavy doped source/drain contact areas by ion implantation while using the sidewall spacer to mask the LDD region from the heavy doped implant. A silicide layer is usually then formed on the contact to further reduce the resistance. However, the high energy implant in the contact areas lead to crystal damage that is very difficult to anneal out and can generally leads to high leakage currents at the diffused junction. Also, aligning the contacts openings to source/drain areas through the overlying insulator is difficult because of their small area size.

Another serious problem occurs when metal contacts are made to the heavily doped source/drain contact areas. To minimize short channel effects during down scaling, the source/drain contacts in the crystalline substrate are made as shallow as possible. When metal contact, such as aluminum, are made to the substrate the metal is known to react with the silicon. Silicon atoms diffuse from the substrate into the aluminum metal and metal spikes form in the underlying substrate shorting the contact to the substrate. This is particularly so at the source/drain contact edge near the field oxide.

Therefore, there is still a strong need in the semiconductor industry for better methods of forming low resistance source/drain area contacts while retaining the advantages of down scaling and the lightly doped drain on the FET device.

SUMMARY OF THE INVENTION

It is the principle object of this invention to provide a self-aligned polysilicon source/drain contact on a N-channel and a P-channel FET having a lightly doped source/drain and low contact resistance.

It is another object of this invention to provide a self-aligned polysilicon source/drain contact on a N-channel and a P-channel FET having a shallow junction.

It is still another object of the invention to provide a self-aligned polysilicon source/drain contact on a N-channel and a P-channel FET and implanting the dopant therein to produce an implant damage free N+ and P+ source/drain junctions.

In accordance with these objectives the invention provides a new polysilicon pad structure and a method for forming said structure over the source/drain areas of N-channel and P-channel FETs. The polysilicon regions or pads are patterned by conventional photolithographic techniques and plasma etching. These polysilicon pads are made larger than the source/drain areas and are thereby self-aligned to the source/drain areas. The polysilicon is then selectively implanted with ions of the correct dopant atomic species for the P+ and N+ contacts and a drive-in thermal anneal is used to form the shallow source/drain buried contacts. The ion implantation into the polysilicon pads prevents crystal damage from occurring in the substrate, and the polysilicon pad overlapping the edge of the field oxide prevent spiking of the metal contact through the source/drain and shorting to the well region thereunder, that would otherwise occur if the pad was not present.

The method begins by providing a semiconductor substrate, such as a P− doped single crystal silicon having a <100> crystallographic orientation. P-type and N-typed well areas are then formed in the substrate. This is accomplished by forming a patterned photoresist mask leaving the substrate exposed in areas where N-well are required. The substrate is then implanted with N-type dopant ions, such as phosphorus ions (P$^-$). The first photoresist is then removed and the process repeated, using a second patterned photoresist mask, to expose the areas where the P-well is required and P-type dopant ions are implanted, such as boron ions (B$^{11}$). The substrate is annealed to drive-in the dopants and thereby provide P-wells and N-well of the require depth and concentration. A thick field oxide is then grown to form and isolate the device areas wherein the N and P-channel FETs are constructed.

The gate electrodes of the N-channel and P-channel FETs are formed, respectively, in the P-well and N-well device areas having first formed on the surface a thin gate oxide. The gate electrodes are formed by depositing a first polysilicon layer having a first insulating layer and then patterning the layers by conventional photolithography and etching techniques. The Lightly Doped Drain (LDD) areas are fabricated next by masking with photoresist and implanting the appropriate N- and P-type dopant in each of the well areas adjacent to the gate electrodes. After forming the LLD areas by implant, an insulating sidewall spacers are formed on the sidewalls of the gate electrodes.

The thin gate oxide is now removed from the source/drain areas adjacent to the sidewall spacers on the gate electrodes of the FETs, such as by using a wet etching. A second polysilicon layer is then blanket deposited on the substrate. This layer is an important part of the invention because it is used to form the polysilicon pad contacts which are self-aligned to the source/drain areas providing shallow, implant damage free junctions having low contact resistance.

The second polysilicon layer is now patterned using conventional photolithographic techniques and plasma etching to form polysilicon pad that are over and larger in area than the source/drain areas of the FETs. The pads formed from the second polysilicon layer are then implanted with N-type dopant ions, such as As$^+$, over the P-well areas and with P-type dopant ions, such as BF$_2^+$, over the N-well areas. A patterned photoresist layer is used as an implant mask to avoid ions being implanted in areas not requiring the implant. The substrate is then annealed, after removing the photoresist, to drive in the dopants from the polysilicon pads into the source/drain areas of the crystalline substrate and thereby forming the shallow junctions for the N-channel and P-channel FETs. Because the source/drain contacts are out diffused from the polysilicon pads and not directly implanted, there is no implant damage. Also, since the pads overlap the edge of the source/drain area the metal contact does not cause spiking.

The substrate having LDD-FETs formed by this invention are now ready for further conventional processing to complete the circuit, such as for making dynamic random access memory (DRAM), static random access memory (SRAM), microprocessors and other integrated circuit chips requiring Complimentary Metal Oxide Silicon (CMOS) circuits and the likes.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

Now in keeping with the objects of the invention, the method for forming N-channel and P-channel FET device using the self-aligned polysilicon pad of this invention is covered in detail. These new FET structures with polysilicon pad can be used to manufacture ULSI circuits such as DRAMs, SRAM, microprocessor circuits and the likes.

Figure 1:
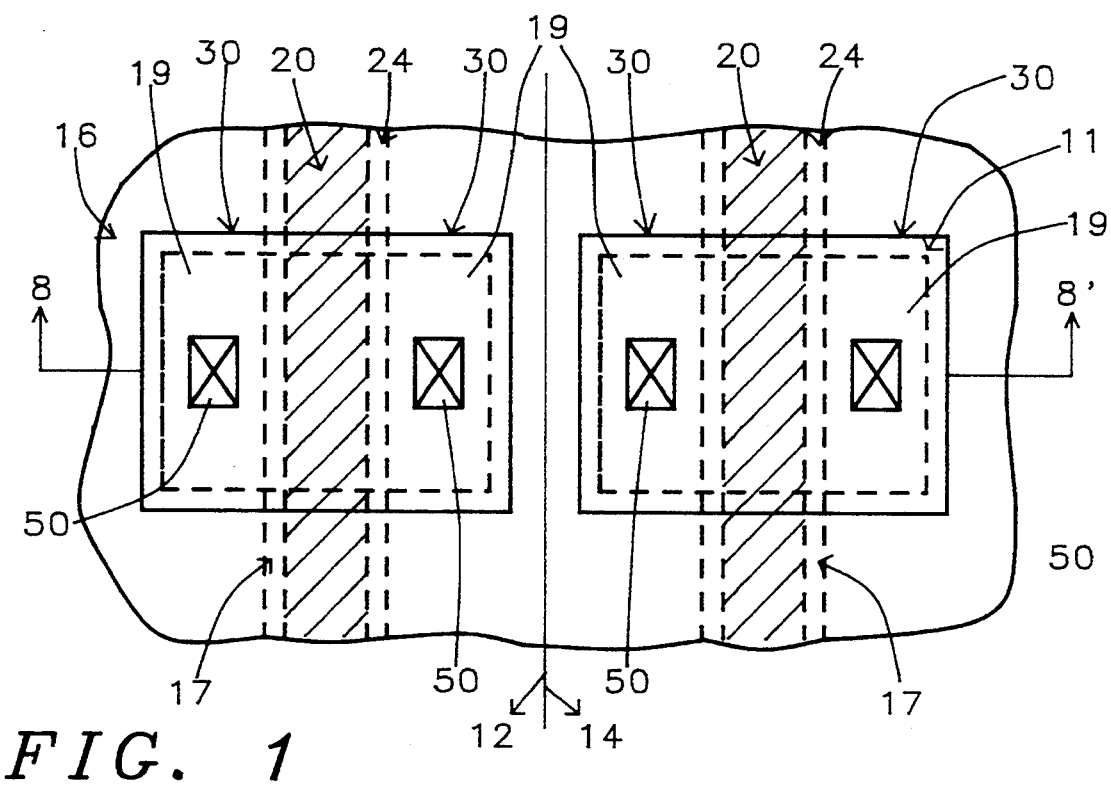
FIG. 1, which schematically illustrates in elevational view the polysilicon pads formed on the source/drain areas of the P and N-channel FETs. The cross section 8-8' is shown in FIG. 8 as indicated in FIG. 1, and FIGS. 2 through 8, which schematically illustrates in cross sectional representation the preferred embodiment for fabrication N-channel and P-channel FETs having the self-aligned polysilicon pad contacts on the source/drain areas.

Referring now to FIG. 1, an elevational view is shown of a N and P-channel FET formed simultaneously on the substrate using the fabrication process of this invention. The active device area 11 is shown by broken line surrounded by the thick field oxide 16. The polysilicon gate electrode 20 with an insulating layer 22 thereon is shown extending over the active device area. The LDD source/drain areas 17 are formed on each side of the gate electrode and then insulating sidewall spacers 24 are formed on each side of the gate electrode. Now applying the method of this invention the self-aligned polysilicon pads 30 are formed over both source/drain areas 19 and overlap the field oxide 16 and the sidewall spacers 24. The polysilicon pads are then appropriately doped by implantation and annealed to diffuse in the dopant and form the source/drain ohmic contact in the substrate. A second insulating layer 46 is deposited over the substrate and contact openings 50 are formed in layer 46 to the polysilicon pads 30.

The polysilicon pad process provides a means for electrically contacting the extremely small source/drain contact areas 19 of the FETs, thereby providing a better ohmic contact without metal spiking at the source/drain edge and without implant crystal damage. Only those details of the underlying device structure will be described that are necessary for understanding the current invention.

Figure 2:
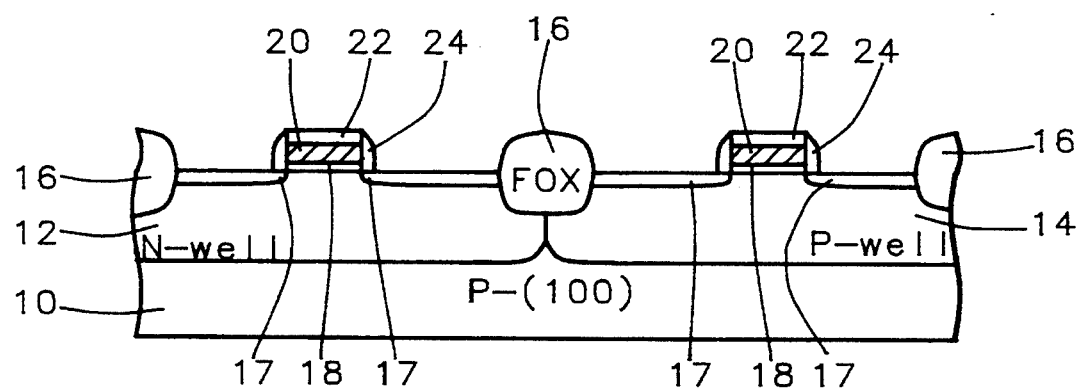

Now as shown in FIG. 2, a cross sectional view of the device structure is depicted. The preferred substrate 10 is typically composed of a P-type single crystal silicon with a <100> crystallographic orientation, alternatively, an N-type substrate also can be used. The separate N-well 12 and P-well 14 are formed next by selectively implanting the appropriate dopant in each well area. Conventional photolithographic techniques are used to mask the substrate in areas not requiring the implant. For example, the N-well 12 is formed by implanting dopant ions such as phosphorus (P$^{31}$) and the photoresist mask is removed and a second patterned photoresist mask is used to implant the P-well 14, such as with boron (B$^{11}$) ions. After removing the second photoresist mask, the substrate is then annealed, to drive-in the dopants to achieve the required junction depth and concentration. The typical depth of the N and P-wells being between about 1 to 5 micrometers. The typical concentration of the phosphorus (P$^{31}$) being between about 5 E 12 to 2 E 13 atoms/cm$^3$ and the typical boron (B$^{11}$) concentration being between about 5 E 12 to 2 E 13 atoms/cm$^3$.

A thick Field OXide (FOX) 16, also shown in FIG. 2, is now formed surrounding and isolating the active device areas wherein the field effect transistor devices are to be built. Briefly, the method commonly practiced in the industry for forming the Field OXide (FOX) 16 consists of using a thin thermal oxide (pad oxide) and a silicon nitride layer as an oxidation resistant mask. The desired field oxide regions are etched open in the oxide/nitride layer using conventional photolithographic techniques and a field oxide is thermally grown, typically to a thickness of about 4500 to 8000 angstroms.

The semiconductor devices are then fabricated on the silicon surface in the non-oxidize areas, after removing the silicon nitride layer using a wet etch. For example, using a solution of heated phosphoric acid ($H_3PO_4$). For the DRAM, SRAM cell and microprocessor circuits, the typical transistor used is a field effect transistor (FET) and is now briefly described. The silicon surface is first carefully cleaned and a good quality thermal oxide is grown to form the gate oxide 18, as shown in FIG. 1. The preferred thickness is between about 4500 to 6000 Angstroms.

Next, the gate electrode structure for the N-channel and P-channel FETs are formed by depositing a first polysilicon layer 20, for example, using a low pressure chemical vapor deposition (LPCVD) process. The preferred thickness of layer 20 is usually in the range from between about 2000 to 4000 Angstroms. The polysilicon layer 20 is then doped N-type. Typically the N-type dopant species is phosphorus having a concentration of between about 1 E 20 to 1 E 21 atoms/cm$^3$. A first insulating layer 22 is deposited over the polysilicon layer 20 and then patterned to form the gate electrodes 20 having the insulating layer 22 thereon, as shown in FIG. 2. The first insulating layer 22 is usually formed by low pressure chemical vapor deposition (LPCVD) of silicon oxide ($SiO_2$), for example, using a tetrethoxysilane (TEOS) reactant gas. The preferred thickness of layer 22 being between about 1500 to 3000 Angstroms.

Although the first polysilicon layer 20 is shown in FIG. 2 as a single layer, it is common practice in the semiconductor industry to provide on the polysilicon layer a silicide, such as tungsten silicide ($WSi_2$) to enhance the conductivity. The $WSi_2$ thickness is typically about 1000 to 3000 Angstroms.

The next step is to form the lightly doped source/drain 17, of the N-channel and P-channel FETs. This doping is usually accomplished by implanting an N-type dopant species, such as arsenic or phosphorus, in the P-well areas and implanting a P-type species, such as boron or a boron fluoride, such as $BF_2$ in the N-well areas. For example, a typical implantation for the LDD of the N-channel FET might consist of a phosphorous $P^{31}$ at a dose of between 1 to 10 E 13 atoms/cm$^2$ and with an energy of 30 to 80 Kev, while the LDD implant for the P-channel FET might consist of $BF_2$ having a dose of between about 1 E 12 to 1 E 13 atoms/cm$^2$. As is well understood by one skilled in the art, photoresist masking is used to avoid implanting in areas not requiring the implant and thereby, the N type LDD areas are formed in the P wells and the P-type LDD areas are formed in the N-wells.

After forming the N and P type LDD areas, the side wall spacers 24 are formed on the sidewall of the gate electrode structures. These spacers are formed by depositing a blanket conformal layer of low temperature silicon oxide on the substrate and then using an anisotropic plasma etch to etch back to the source/drain surface leaving portions of the silicon oxide on the gate electrode sidewalls. For example, the silicon oxide can be a low pressure chemical vapor deposition using tetraethoxysilane (TEOS) at a temperature in the range of about 650° to 900° C., and the etch back can be accomplished with a reactive plasma etcher of various design and using an appropriate gases mixture. For example, the etching can be performed in a gas mixture of carbon tetrafluoride and hydrogen ($CF_4/H_2$). Alternatively, a gas mixture containing trifluoromethane ($CHF_3$) can also be used.

The remainder of this embodiment relates more particularly to that part of the invention which describes in detail the formation of the self-aligned polysilicon pad on the source/drain areas which substantially improve the electrical characteristics and reliability of the FETs.

Figure 3:
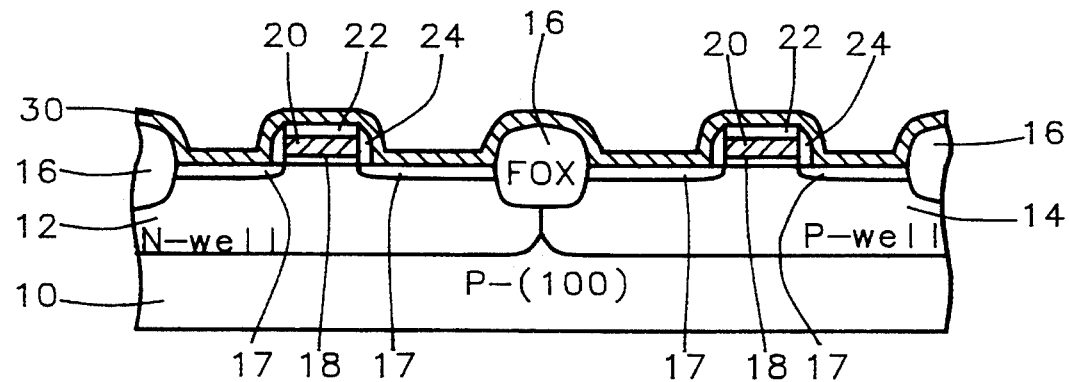

Referring now to FIG. 3, a second polysilicon layer 30 is blanket deposited on the substrate 10. Prior to depositing the polysilicon a good electrical interface is assured by performing a short buffer hydrofluoric acid etch. This etch is performed to remove any remaining gate oxide and naturally occurring oxide that may have formed on the source/drain areas 17 of the substrate. The second polysilicon layer 30 is now deposited undoped using, for example, low temperature chemical vapor deposition (LPCVD) and the preferred thickness of layer 30 is between about 500 to 2000 Angstroms.

Figure 4:
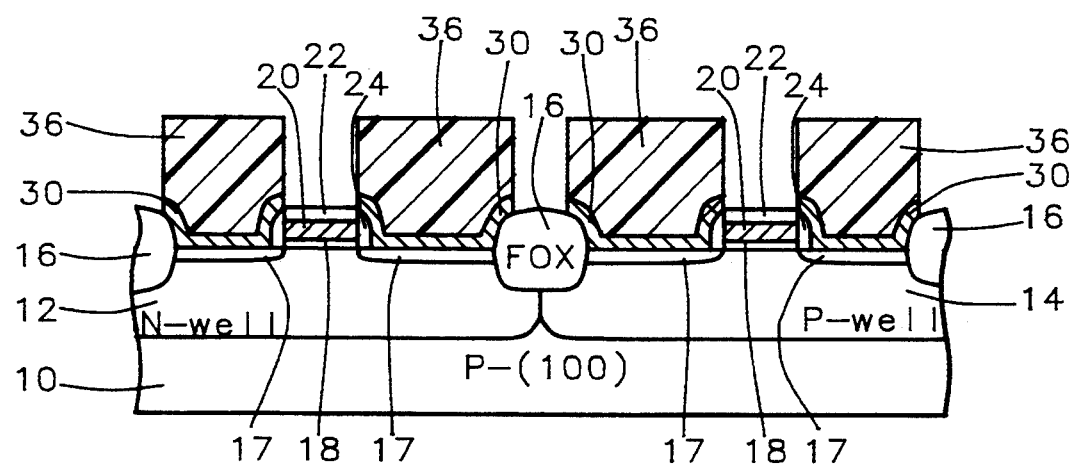

The second polysilicon layer 30 is then patterned using conventional photolithographic techniques and anisotropic plasma etching to form polysilicon pads 30 over the source/drain areas of N and P-channel FETs, as shown in FIG. 4. The polysilicon pads 30, are shown in FIG. 4, with the patterned photoresist mask 36 still in place. The polysilicon pads 30 are patterned over source/drain contact areas 17 so that the polysilicon pad completely cover the substrate areas 17 and overlap the field oxide areas 16 and the sidewall spacers 24. This overlap is important because it protects the substrate source/drain areas 17 from implant damage that can result in unacceptable high leakage currents at the junctions and prevents metal spiking that can cause electrical short between the source/drain contacts and the N-well and P-well areas 12 and 14.

Figure 5:
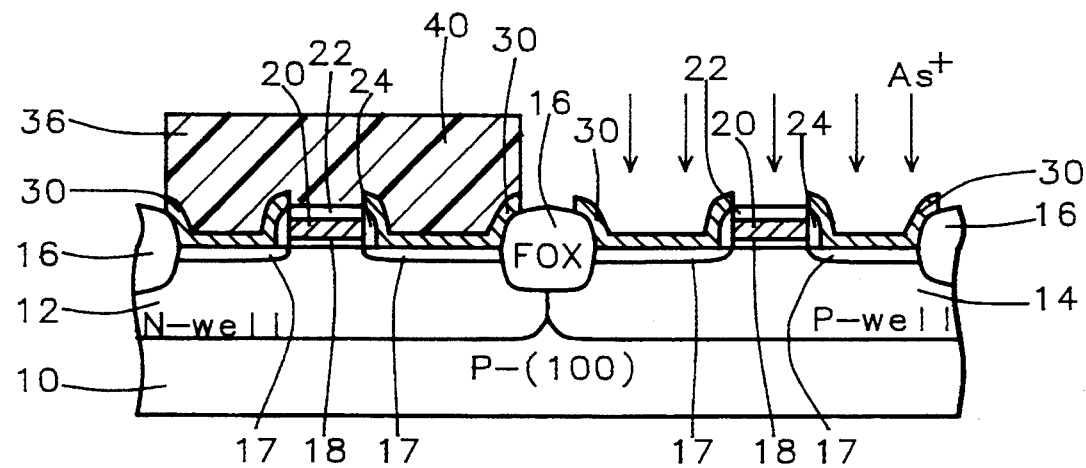

Referring next to FIG. 5, conventional photolithographic techniques are used to pattern a second photoresist layer 40 thereby masking the N-well areas and leaving exposed the self-aligned polysilicon pads 30 over the source/drain areas in the P-well areas 14. The substrate is then placed in an ion implanter and implanted with N-type ion species, such as arsenic ($As^{75+}$) to dope the polysilicon pads. The preferred implantation dose is between about 5 E 14 to 5 E 15 atoms/cm$^2$ and the ion implantation energy is between about 30 to 80 KeV. The thickness of the polysilicon pad and the implant energy of the arsenic ions are selected so that the implant projected range plus three times the projected standard deviation (projected straggle) lies well within the polysilicon pad layer 30. This insures that the implanted ions do not enter the underlying single crystal causing crystal damage which is then difficult to anneal out. For this particular example, for example, at an energy of 60 KeV, the arsenic ion projected range is about 370 Angstroms and the 3 times projected standard deviation is about 480 Angstroms.

Figure 6:
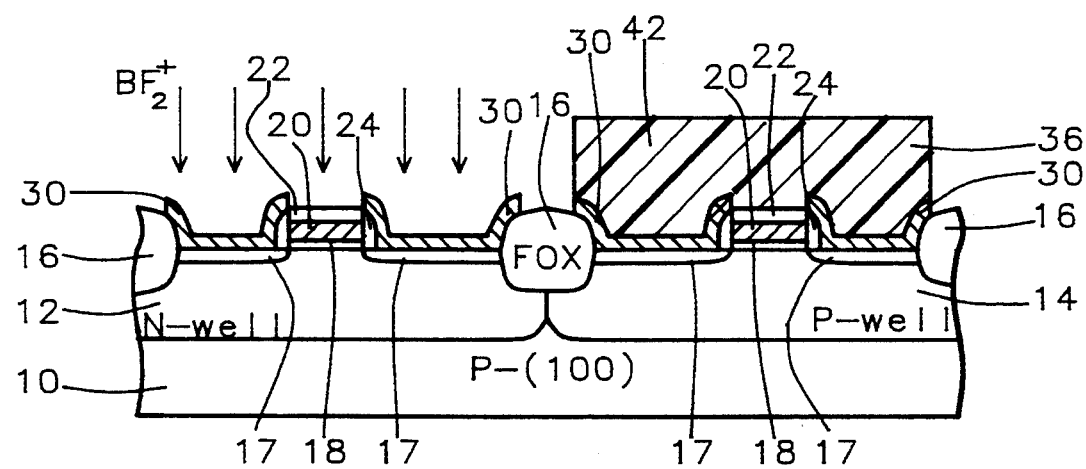

Referring now to FIG. 6, the second photoresist layer 40 is removed by conventional techniques, such as plasma ashing in oxygen, and a patterned third photoresist layer 42 is formed by conventional photolithographic techniques to mask the P-well areas 14, leaving exposed now the polysilicon pads over the source/drain areas in the N-well areas 12. The substrate is again placed in an ion implanter and implanted with a P-type dopant species, such as boron ions or more specifically implanting with $BF_2$ ions formed in the ion source of the implanter by dissociating boron trifluoride ($BF_3$). The preferred ion implant dose is between about 5 E 14 to 5 E 15 atoms/cm$^2$ and the preferred ion implantation energy is between about 50 to 100 KeV. As was the situation for the arsenic ion implantation, the implant energy for the $BF_2+$ is selected to insure that the projected range plus 3 times the projected standard deviation is well within the polysilicon pad layer 30. This is also done to avoid the crystal damage that would arise if the implant was directly into the single crystal silicon substrate. For example, the projected range of the $BF_2+$ ions, for an implant energy of about 50 KeV in the polysilicon layer, is about 500 Angstroms and the 3 times projected standard deviation is about 800 Angstroms.

Figure 7:
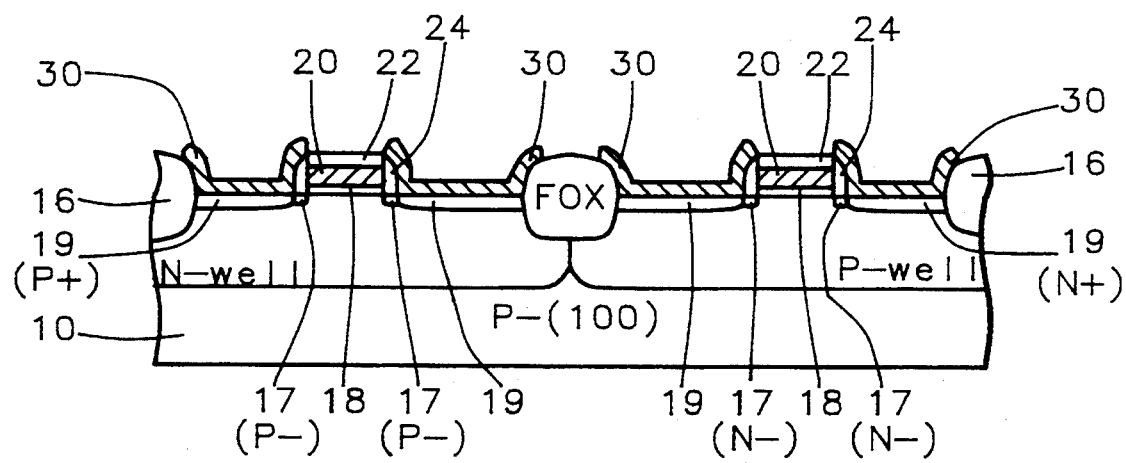

Referring now to FIG. 7, the third photoresist layer 42 is removed in a similar fashion as the second photoresist layer 40 and the substrate is then annealed at an elevated temperature to diffuse the N and P-type dopants from the polysilicon pads 30 into the source/drain areas 17 in the P-well and N-well areas of the single crystal silicon substrate 10, and thereby forming, respectively, the source/drain diffused contacts 19 for the N-channel and P-channel FETs, as shown in FIG. 7. The preferred drive-in annealing is performed in a furnace having an ambient inert gas, such as argon (Ar) or nitrogen ($N_2$) at an anneal temperature of between about 800° to 900° C. The drive-in anneal time is selected to achieve a shallow diffused contact junction depth in the substrate of between about 0.1 to 0.3 micrometers for the arsenic doped areas and a junction depth of 0.1 to 0.3 micrometers for the boron doped areas.

Figure 8:
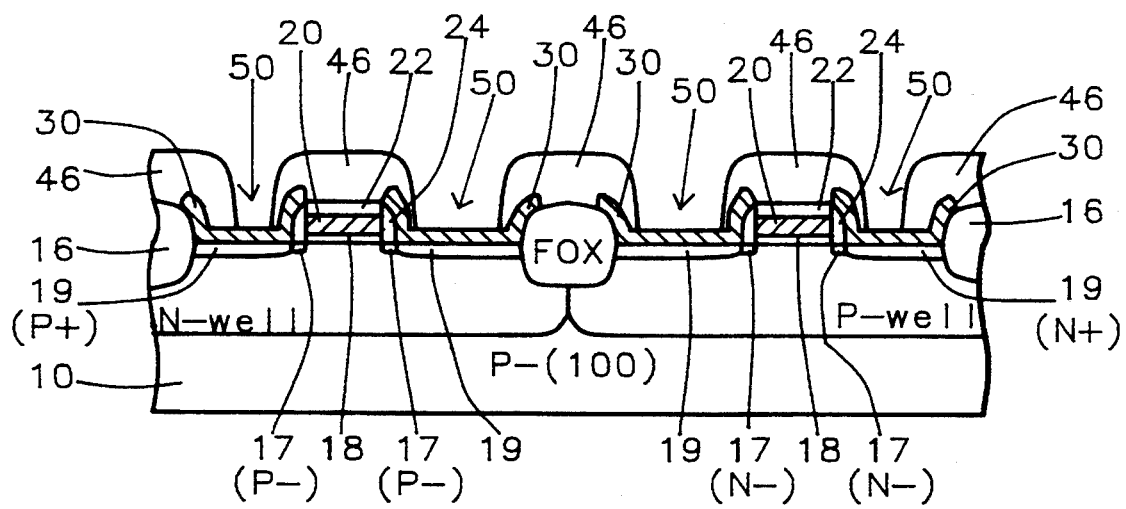

The N-type and P-type FET structures are then completed, as shown in FIG. 8, by depositing a blanket second insulating layer 46, such as a low pressure chemical vapor deposited (LPCVD) silicon oxide, and providing contact opening 50 to the self-aligned polysilicon pad 30 for the interconnecting patterned metallurgy layer. The metallurgy layer is not shown in the FIG. 8. The preferred thickness of the insulating layer 46 being between about 4000 to 10000 Angstroms. As shown in FIG. 8 and FIG. 1, the design ground rules can be relaxed for the contact opening 50 in layer 46 because the self-aligned polysilicon pad 30 can be made substantially larger in area than the source/drain area.

While the invention has been particularly shown and described with reference to the preferred embodiments thereof, it will be understood by those skilled in the art that various changes in form and details may be made without departing from the spirit and scope of the invention.

What is claimed is:

1. A method for fabricating N-channel and P-channel field effect transistors having self-aligned polysilicon pad source and drain contacts, comprising the steps of:
   providing a semiconductor substrate with doped P-well and N-well device areas formed therein and a gate oxide formed thereon with isolation field oxide areas formed elsewhere on said substrate;
   depositing a first polysilicon layer on said substrate; and
   doping by implantation said first polysilicon layer;
   depositing a first insulating layer on said first polysilicon layer; and
   patterning said first polysilicon layer and first insulating layer, thereby forming gate electrodes on said P-well and N-well device areas;
   doping by implantation with N-type dopant ions portions of said P-well device areas and forming N-type source and drain diffused areas and thereby forming the lightly doped drain (LDD) for the N-channel FET;
   doping by implantation with P-type dopant ions portions of said N-well device areas and forming P-type source and drain diffused areas and thereby forming the lightly doped drain (LDD) for the P-channel FET;
   depositing a conformal sidewall insulating layer on said substrate and anisotropically etching back to the surface of said first insulating layer and thereby forming sidewall spacers on said gate electrodes;
   depositing a second polysilicon layer over said substrate and thereby coating said gate electrodes and said P-well and N-well devices area;
   patterning said second polysilicon layer leaving portions over said N-type and P-type source and drain areas and removing said layer elsewhere on said substrate, thereby forming polysilicon pads over said source and drain areas;
   doping by implanting with N-type dopant ions said polysilicon pads selectively over said N-type source and drain areas and doping said polysilicon pads with P-type dopant ions over said P-type source and drain areas;
   annealing by heating said substrate and thereby diffusing in said dopant ions from said polysilicon pad into said source and drain areas and forming contacts;
   depositing a second insulating layer over said polysilicon pads and elsewhere on said substrate;
   forming openings in said second insulating layer over said polysilicon pads and completing said N-channel and P-channel field effect transistors having contact openings.

2. The method of claim 1, wherein a thickness of said first polysilicon layer is between 2000 to 4000 Angstroms and is doped with N type impurities.

3. The method of claim 1, wherein a thickness of said first insulating layer is between 1500 to 3000 Angstroms.

4. The method of claim 1, wherein said lightly doped drain (LDD) for said N-channel FET is formed by implantation of phosphorus ($P^{31+}$) ion having a dose of between 1 E 13 to 1 E to 14 ions/cm$^2$ and an implant energy of between 30 to 80 KeV.

5. The method of claim 1, wherein said lightly doped drain (LDD) for said P-channel FET is formed by implantation of boron fluoride ($BF_2+$) ion having a dose of between 1 E 12 to 1 E 13 ions/cm$^2$ and an implant energy of between 40 to 100 KeV.

6. The method of claim 1, wherein a thickness of said second polysilicon layer is between 500 to 2000 Angstroms.

7. The method of claim 1, wherein said polysilicon pads formed on said P-well device area is doped with arsenic ions ($As^{75+}$) by ion implantation and having a dose of 5 E 14 to 5 E 15 atoms/cm$^2$ and an ion implant energy of between 30 to 80 KeV.

8. The method of claim 1, wherein said polysilicon pads formed on said N-well device areas is doped with boron by implantation of $BF_2^{30}$ having an implant dose of between 5 E 14 to 5 E 15 molecules/cm$^2$ and an ion implant energy of between 40 to 100 KeV.

9. The method of claim 1, wherein said annealing electrically activates said N-type and P-type dopant ions into said substrate source and drain areas forming junctions.

10. The method of claim 9, wherein said junctions are formed to a junction depth of between 0.1 to 0.3 micrometers.

* * * * *